United States Patent
Azuma et al.

(10) Patent No.: US 11,021,572 B2
(45) Date of Patent: Jun. 1, 2021

(54) PHOTOSENSITIVE RESIN COMPOSITION, CURED PRODUCT OF SAME, INTERLAYER INSULATING FILM, SURFACE PROTECTIVE FILM AND ELECTRONIC COMPONENT

(71) Applicant: HITACHI CHEMICAL DUPONT MICROSYSTEMS, LTD., Tokyo (JP)

(72) Inventors: Ayaka Azuma, Hitachi (JP); Satoshi Abe, Hitachi (JP); Kazuya Soejima, Hitachi (JP); Masato Nishimura, Tokyo (JP); Tadamitsu Nakamura, Hitachi (JP)

(73) Assignee: HD MICROSYSTEMS, LTD., Tokyo (JP)

( * ) Notice: Subject to any disclaimer, the term of this patent is extended or adjusted under 35 U.S.C. 154(b) by 0 days.

(21) Appl. No.: 16/320,889

(22) PCT Filed: Jul. 25, 2017

(86) PCT No.: PCT/JP2017/026749
§ 371 (c)(1),
(2) Date: Jan. 25, 2019

(87) PCT Pub. No.: WO2018/021262
PCT Pub. Date: Feb. 1, 2018

(65) Prior Publication Data
US 2019/0161580 A1    May 30, 2019

(30) Foreign Application Priority Data
Jul. 27, 2016  (JP) .............. JP2016-147805

(51) Int. Cl.
| | | |
|---|---|---|
| C08G 73/10 | (2006.01) |
| C08G 73/22 | (2006.01) |
| G03F 7/023 | (2006.01) |
| G03F 7/022 | (2006.01) |
| G03F 7/085 | (2006.01) |
| G03F 7/038 | (2006.01) |

(52) U.S. Cl.
CPC ......... *C08G 73/10* (2013.01); *C08G 73/1071* (2013.01); *C08G 73/22* (2013.01); *G03F 7/023* (2013.01); *G03F 7/0226* (2013.01); *G03F 7/0233* (2013.01); *G03F 7/0387* (2013.01); *G03F 7/085* (2013.01)

(58) Field of Classification Search
None
See application file for complete search history.

(56) References Cited

FOREIGN PATENT DOCUMENTS

| | | |
|---|---|---|
| JP | 2005-99661 A | 4/2005 |
| JP | 2009-283711 A | 12/2009 |
| JP | 2010-096927 A | 4/2010 |
| JP | 2012-141447 A | 7/2012 |
| JP | 2014-529632 A | 11/2014 |
| JP | 2015-141352 A | 8/2015 |
| JP | 2016-167036 A | 9/2016 |
| WO | 2009/022732 A1 | 2/2009 |
| WO | 2014/097633 A1 | 6/2014 |
| WO | 2015/199219 A1 | 12/2015 |

*Primary Examiner* — Samantha L Shterengarts
(74) *Attorney, Agent, or Firm* — Fitch, Even, Tabin & Flannery, LLP

(57) ABSTRACT

Provided is a photosensitive resin composition containing; (A) a polymer having an acidic functional group or a substituent derived therefrom; (B) a photoreactive compound; (C) a solvent; and (D) a nitrogen-containing aromatic compound represented by the following general formula (1).

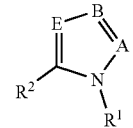

(1)

7 Claims, No Drawings

PHOTOSENSITIVE RESIN COMPOSITION, CURED PRODUCT OF SAME, INTERLAYER INSULATING FILM, SURFACE PROTECTIVE FILM AND ELECTRONIC COMPONENT

CROSS-REFERENCE TO RELATED APPLICATIONS

This application is a U.S. national phase application filed under 35 U.S.C. § 371 of International Application No. PCT/JP2017/026749, filed Jul. 25, 2017, designating the United States, which claims priority from Japanese Patent Application No. 2016-147805 filed Jul. 27, 2016, which is hereby incorporated herein by reference in its entirety.

TECHNICAL FIELD

The present invention relates to a photosensitive resin composition, a cured product of the same, an interlayer insulating film, a surface protective film and an electronic component.

BACKGROUND ART

A polyimide resin film, a polybenzoxazole resin film or the like having excellent heat resistance, electrical characteristics, mechanical characteristics and the like in combination has been used so far for a surface protective film or an interlayer insulating film of a semiconductor device (for example, Patent Document 1). The polyimide resin film or the polybenzoxazole resin film can be formed of a photosensitive resin composition containing a polyimide precursor or a polybenzoxazole precursor.

In recent years, reduction in size, thickness or weight has rapidly progressed in an electronic device such as a digital camera and a mobile phone, and higher integration and reduction in size have progressed also in the semiconductor device in association therewith. As the semiconductor device adaptable to such reduction in size and achievement of high density, a packaging system called CSP (chip size package) has been widely spread. In general, the CSP has a wiring pattern as a redistribution layer, an interlayer insulating layer, a conductive ball for external connection and the like on a silicon wafer.

RELATED ART DOCUMENT

Patent Documents

Patent Document 1: WO2009/022732

SUMMARY OF THE INVENTION

However, density of a redistribution layer is increased in association with achievement of high function of CSP, in which a surface area of wiring formed of gold, copper, nickel or the like increases relative to a surface area of a semiconductor device. Accordingly, a photosensitive resin composition used upon forming a surface protective layer or an interlayer insulating layer of the semiconductor device is required to have by far superior adhesion with the wiring thereof. However, thermal stress generated in the insulating layer tends to increase by high density of the redistribution layer, and therefore peeling between the insulating layer and the redistribution layer or the like has been easily caused. Moreover, a cured film having little discoloration has been required.

An objective of the invention is to provide a photosensitive resin composition from which a film having little discoloration and good adhesion can be formed, a cured product of the same, an interlayer insulating film or a surface protective film using the cured product, and an electronic component having the interlayer insulating film or the surface protective film.

According to the invention, the following photosensitive resin composition and the like are provided.

1. A photosensitive resin composition, containing:
   (A) a polymer having an acidic functional group or a substituent derived therefrom;
   (B) a photoreactive compound;
   (C) a solvent; and
   (D) a nitrogen-containing aromatic compound represented by the following general formula (1):

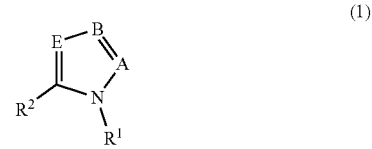

(wherein, $R^1$ is a hydrogen atom or a hydrocarbon group, $R^2$ is a hydrogen atom, an amino group, an alkyl group, an alkenyl group, a cyclic aliphatic group having 3 to 10 carbon atoms or a phenyl group, and A, B, and E are each independently N or $CR^3$; $R^3$ is a hydrogen atom or a monovalent organic group; and when a plurality of $R^3$ exist, the plurality of $R^3$ may be identical to or different from each other).

2. The photosensitive resin composition according to 1, wherein the component (A) is one or more selected from the group consisting of a polyimide precursor, a polybenzoxazole precursor and a copolymer thereof.

3. The photosensitive resin composition according to 2, wherein the polybenzoxazole precursor has a structural unit represented by the following general formula (2-1) and a structural unit represented by the following general formula (2-2):

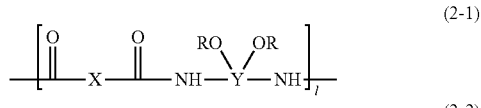

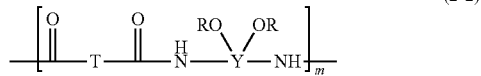

(wherein, X and T are each independently a divalent organic group, and X is a group different from T; Y is a tetravalent organic group, and R is each independently a hydrogen atom or a monovalent organic group; and l and m are a mole fraction, and when a sum of l and m is taken as 100 mol %, l is 60 to 100 mol % and m is 0 to 40 mol %).

4. The photosensitive resin composition according to 2, wherein the polyimide precursor has a structural unit represented by the following general formula (3-1) and a structural unit represented by the following general formula (3-2):

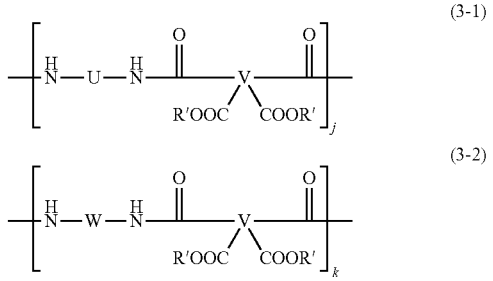

(wherein, U and W are each independently a divalent organic group, and U is a group different from W; V is a tetravalent organic group; R' is each independently a hydrogen atom or a monovalent organic group; and j and k are a mole fraction, and when a sum of j and k is taken as 100 mol %, j is 60 to 100 mol % and k is 0 to 40 mol %).

5. The photosensitive resin composition according to any one of 1 to 4, wherein the component (D) is a compound having a triazole skeleton or a tetrazole skeleton.

6. A cured product of the photosensitive resin composition according to any one of 1 to 5.

7. An interlayer insulating film or a surface protective film, using the cured product according to 6.

8. An electronic component, having the interlayer insulating film according to 7 or the surface protective film according to 7.

According to the invention, the photosensitive resin composition from which a film having little discoloration and good adhesion can be formed, the cured product of the same, the interlayer insulating film or the surface protective film using the cured product, and the electronic component having the interlayer insulating film or the surface protective film can be provided.

MODE FOR CARRYING OUT THE INVENTION

Hereinafter, a mode for carrying out the invention will be described in detail. However, the invention is not limited to embodiments described below.

In addition, a term "A or B" in the present specification only needs to include either A or B, or may include both. Moreover, a term "step" herein includes not only an independent step, but also a step if expected action of the step is achieved, even when the step is clearly undistinguishable from other steps.

A numeric value range expressed by using "to" indicates the range including numeric values described before and after "to" as a minimum value and a maximum value, respectively. Moreover, when a plurality of materials corresponding to each component exist in a composition, unless otherwise specified, a content of each component in the composition herein means a total amount of the plurality of materials existing in the composition. Further, unless otherwise specified, materials listed as examples may be used alone or may be used in combination of two or more kinds thereof.

A term "(meth)acrylic acid alkyl ester" herein means "acrylic acid alkyl ester" and "methacrylic acid alkyl ester" corresponding thereto. Moreover, a term "(meth)acrylate" means "acrylate" and "methacrylate" corresponding thereto.

A photosensitive resin composition of the invention contains (A) a polymer having an acidic functional group or a substituent derived therefrom (hereinafter, also referred to as a "component (A)"), (B) a photoreactive compound (hereinafter, also referred to as a "component (B)"), (C) a solvent (hereinafter, also referred to as a "component (C)") and (D) a nitrogen-containing aromatic compound represented by the following general formula (1) (hereinafter, also referred to as a "component (D)").

In the formula, $R^1$ is a hydrogen atom or a hydrocarbon group, $R^2$ is a hydrogen atom, an amino group, an alkyl group, an alkenyl group, a cyclic aliphatic group having 3 to 10 carbon atoms or a phenyl group, and A, B, and E are each independently N or $CR^3$. $R^3$ is a hydrogen atom or a hydrocarbon group. When a plurality of $R^3$ exist, the plurality of $R^3$ may be identical to or different from each other.

The photosensitive resin composition of the invention can form a film having little discoloration and good adhesion by having the above-described structure, when the composition is cured.

Hereinafter, each component will be described.

(Component (A))

Specific examples of the acidic functional group of the component (A) include a carboxy group and a phenolic hydroxy group.

Moreover, as the substituent derived from the acidic functional group, a group in which a hydrogen atom of the above-described acidic functional group is replaced by a monovalent organic group is preferred.

Specific examples of the monovalent organic group of the substituent derived from the acidic functional group include a hydrocarbon group having 1 to 20 carbon atoms (preferably 1 to 15 carbon atoms), such as an alkyl group (preferably having 1 to 20 carbon atoms), an aryl group (preferably having 5 to 20 ring forming carbon atoms), a cycloalkyl group (preferably having 5 to 20 ring forming carbon atoms) and an aralkyl group (preferably having 6 to 20 carbon atoms); an alkoxyalkyl group (preferably having 2 to 20 carbon atoms); an aryloxyalkyl group (preferably having 6 to 20 carbon atoms); a heterocyclic group (preferably having 5 to 20 ring forming atoms); a silyl group; and an oxocycloalkyl group (preferably having 5 to 20 ring forming atoms).

The acidic functional group or the substituent derived from the acidic functional group may have a substituent (hereinafter, also referred to as an "arbitrary substituent").

Specific examples of the arbitrary substituent include an alkyl group having 1 to 6 carbon atoms, an alkoxy group having 1 to 6 carbon atoms, an alkylthio group having 1 to 6 carbon atoms, a nitro group, a halogen atom such as a fluorine atom, a benzoxy group, a hydroxy group, a trimethylsilyl group and an aryl group having 5 to 15 carbon atoms.

Among the monovalent organic groups and the arbitrary substituents described above, the groups adjacent to each other may be bonded to form a ring. Specific examples of the ring to be formed include a benzene ring and a cyclohexyl ring.

The monovalent organic group of the substituent derived from the acidic functional group may include a hetero atom such as oxygen, sulfur, nitrogen and silicon, or an organic group such as a ketone group, an ester group and an amide group in a skeleton thereof.

Specific examples of the monovalent organic group of the substituent derived from the acidic functional group include a methyl group, an ethyl group, a propyl group, an isopropyl group, an n-butyl group, an s-butyl group, a t-butyl group, a cyclopropenyl group, a cyclobutyl group, a cyclopentyl group, a cyclohexyl group, a cyclohexylmethyl group, a cyclohexenyl group, a norbornyl group, a norbornenyl group, an adamantyl group, a benzyl group, a p-nitrobenzyl group, a trifluoromethyl group, a methoxyethyl group, an ethoxyethyl group, a methoxymethyl group, an ethoxymethyl group, a methoxyethoxymethyl group, a benzoxymethyl group, a tetrahydropyranyl group, an ethoxytetrahydropyranyl group, a tetrahydrofuranyl group, a 2-trimethylsilylethoxymethyl group, a trimethylsilyl group, a t-butyldimethylsilyl group, a 3-oxocyclohexyl group, a 9-fluorenylmethyl group, a methylthiomethyl group and a phenyl group, but are not limited thereto.

Moreover, the monovalent organic group of the substituent derived from the acidic functional group may be a residue of hydroxyalkyl (preferably alkyl having 1 to 6 carbon atoms) (meth)acrylate, such as 2-hydroxyethyl methacrylate.

The component (A) is not particularly limited as long as the component is a polymer having the acidic functional group or the substituent derived therefrom, but is preferably one or more selected from the group consisting of a polyimide precursor, a polybenzoxazole precursor and a copolymer thereof. Above all, one or more selected from the group consisting of a polyimide precursor and a polybenzoxazole precursor is further preferred.

The polybenzoxazole precursor is a precursor that can be obtained by allowing a dicarboxylic acid compound to react with a bisaminophenol compound, for example.

The polybenzoxazole precursor preferably has a structural unit represented by a general formula (2-1) and a structural unit represented by a general formula (2-2). Accordingly, good film characteristics can be obtained.

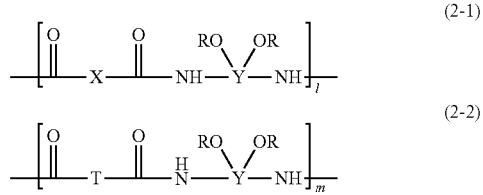

In the general formula (2-1) and the general formula (2-2), X and T are each independently a divalent organic group, and X is a group different from T. Y is a tetravalent organic group, and R is each independently a hydrogen atom or a monovalent organic group. Then, l and m are a mole fraction, and when a sum of l and m is taken as 100 mol %, l is 60 to 100 mol % and m is 0 to 40 mol %.

The polybenzoxazole precursor may be a block copolymer having two kinds of the structural units described above, or may be a random copolymer having two kinds of the structural units described above.

The mole fractions of l in the general formula (2-1) and m in the general formula (2-2) are preferably 70 to 100 mol % and 0 to 30 mol %, respectively. Accordingly, a dissolution rate during pattern creation can be easily adjusted to a suitable range.

Specific examples of the divalent organic group of X in the general formula (2-1) and T in the general formula (2-2) include a straight chain, branched chain or cyclic aliphatic group or an aromatic group. The aliphatic group or the aromatic group may have a substituent on a main chain. Specific examples of the substituent include a group similar to the arbitrary substituent of the substituent derived from the acidic functional group described above.

Specific examples of the straight chain (preferably having 1 to 30 carbon atoms, more preferably having 5 to 20 carbon atoms), branched chain (preferably having 2 to 30 carbon atoms) or cyclic (preferably having 3 to 30 carbon atoms) aliphatic group include an alkylene group, a cyclopentyl ring-containing group, a cyclohexyl ring-containing group, a cyclooctyl ring-containing group and a bicyclo ring-containing group. The aliphatic group may include a hetero atom such as oxygen, sulfur, nitrogen and silicon, or an organic group such as a ketone group, an ester group and an amide group in a skeleton thereof.

Moreover, specific examples of the above-described aromatic group (preferably having 5 to 30 carbon atoms) include a benzene ring-containing group and a naphthalene ring-containing group. The above-described aromatic group may include a hetero atom such as oxygen, sulfur, nitrogen and silicon. Moreover, the above-described aromatic groups may be a group in which two aromatic groups are bonded by a single bond, a hetero atom such as oxygen, sulfur, nitrogen and silicon, or an organic group such as a ketone group, an ester group and an amide group. Specific examples thereof include a group represented by -Ph-O-Ph- (in which Ph denotes a phenylene group).

Moreover, as the divalent organic group of X in the general formula (2-1) and T in the general formula (2-2), a residue of the dicarboxylic acid compound is preferred.

Specific examples of the dicarboxylic acid compound include dicarboxylic acid having an aliphatic straight chain structure, dicarboxylic acid having an alicyclic structure, and aromatic dicarboxylic acid.

In view of heat resistance, the aromatic dicarboxylic acid is preferred.

Specific examples of the dicarboxylic acid having the aliphatic straight chain structure include malonic acid, methylmalonic acid, dimethylmalonic acid, ethylmalonic acid, isopropylmalonic acid, butylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, octafluoroadipic acid, pimelic acid, 2,2,6,6-tetramethylpimelic acid, suberic acid, dodecafluorosuberic acid, perfluorosuberic acid, itaconic acid, maleic acid, tetrafluoromaleic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid and diglycolic acid.

Specific examples of the dicarboxylic acid having the aliphatic straight chain structure also include dicarboxylic acid represented by a general formula (4), but are not limited thereto.

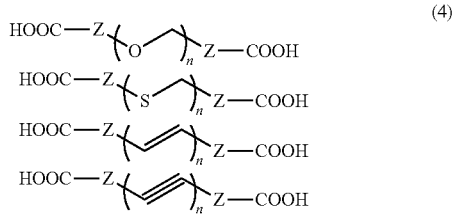
(4)

(In the formula, Z is each independently a hydrocarbon group having 1 to 6 carbon atoms, and n is an integer from 1 to 6).

Specific examples of the dicarboxylic acid having the alicyclic structure include 1,1-cyclobutanedicarboxylic acid, 1,2-cyclobutanedicarboxylic acid, 1,2-cyclopentanedicarboxylic acid, 1,3-cyclopentanedicarboxylic acid, 1,2-cyclohexanedicarboxylic acid, 1,3-cyclohexanedicarboxylic acid, 1,4-cyclohexanedicarboxylic acid, 3,3-tetramethyleneglutaric acid, camphoric acid, 1,3-adamantanedicarboxylic acid and 5-norbornane-2,3-dicarboxylic acid.

Specific examples of the aromatic dicarboxylic acid include isophthalic acid, terephthalic acid, 2,2-bis(4-carboxyphenyl)-1,1,1,3,3,3-hexafluoropropane, 4,4'-dicarboxybiphenyl, 4,4'-dicarboxydiphenyl ether (4,4'-diphenyl ether dicarboxylic acid), 4,4'-dicarboxytetraphenylsilane, bis(4-carboxyphenyl)sulfone, 2,2-bis(p-carboxyphenyl)propane, 5-tert-butylisophthalic acid, 5-bromoisophthalic acid, 2-fluoroisophthalic acid, 3-fluoroisophthalic acid, 5-fluoroisophthalic acid, 5-chloroisophthalic acid, 2,4,5,6-tetrafluoroisophthalic acid, 5-nitroisophthalic acid, 1,4-naphthalenedicarboxylic acid, 2,6-naphthalenedicarboxylic acid, phenylmalonic acid, benzylmalonic acid, 1,2-phenylenedioxydiacetic acid, 1,3-phenylenediacetic acid, 1,4-phenylenediacetic acid, 2,2-iminodibenzoic acid, 3-fluorophthalic acid, 2-fluorophthalic acid, 3,4,5,6-tetrafluorophthalic acid, 4,4'-hexafluoroisopropylidenediphenyldicarboxylic acid, 2,2'-bis(trifluoromethyl)-4,4'-biphenylenedicarboxylic acid, 4,4'-oxydiphenyldicarboxylic acid (diphenyl ether dicarboxylic acid) and 4,4-biphenyldicarboxylic acid.

X is a group different from T, and X is preferably a straight chain, branched chain or cyclic aliphatic group, and T is preferably an aromatic group.

Specific examples of the tetravalent organic group of Y in the general formula (2-1) and the general formula (2-2) include a straight chain, branched chain or cyclic aliphatic group or an aromatic group. The aliphatic group or the aromatic group may have a substituent on a main chain. Specific examples of the substituent include a group similar to the arbitrary substituent of the substituent derived from the acidic functional group described above.

Specific examples of the aliphatic group and the aromatic group of Y include a group similar to a group in which the aliphatic group and the aromatic group of X and T are substituted by two RO groups. Y is preferably the aromatic group in view of developer characteristics or the heat resistance.

Moreover, as the tetravalent organic group of Y in the general formula (2-1) and the general formula (2-2), a residue of the bisaminophenol compound is preferred. In the residue of the bisaminophenol compound, a hydrogen atom of a phenolic hydroxy group may be substituted by R described later.

The bisaminophenol compound is not particularly limited, but specific examples include bis(3-amino-4-hydroxyphenyl)propane such as 2,2'-bis(3-amino-4-hydroxyphenyl)propane, 3,3'-diamino-4,4'-dihydroxybiphenyl, 4,4'-diamino-3,3'-dihydroxybiphenyl, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl-1,1,1,3,3,3-hexafluoropropane, 2,2'-bis(3-amino-4-hydroxyphenyl)hexafluoropropane (2,2-bis(4-amino-3-hydroxyphenyl)-1,1,1,3,3,3-hexafluoropropane).

The residue of the bisaminophenol compound may be used alone in one kind, or in combination with two or more kinds thereof.

The polybenzoxazole precursor can be synthesized by allowing an active ester compound derived from the above-described dicarboxylic acid compound to react with the above-described bisaminophenol compound under an organic solvent, for example. Specific examples thereof include a synthesis method using a reaction of removal of acid halogen between a dichloride derivative of the dicarboxylic acid compound and the bisaminophenol compound.

When the polybenzoxazole precursor is synthesized, a mole equivalent ratio of the dicarboxylic acid compound to the bisaminophenol compound is preferably adjusted to be less than 1 and further preferably 0.6 to 0.98 so that an amino group of the bisaminophenol compound may be a terminal of the precursor.

R in the general formula (2-1) and the general formula (2-2) is preferably a hydrogen atom from a viewpoint of control of solubility during development or pattern processing using a photoreaction.

Moreover, R can be partially a monovalent organic group, and thus alkali solubility can be controlled.

The monovalent organic group of R in the general formula (2-1) and the general formula (2-2) can be introduced into the polyoxazole precursor through an ether bond or an ester bond, for example.

Specific examples thereof include an addition reaction using a reaction of removal of acid halogen between a polyoxazole precursor and a halogen compound or an acid halide compound of a monovalent organic group of R, and an addition reaction of two monovalent organic groups through ether.

Specific examples of R in the general formula (2-1) and the general formula (2-2) include a hydrogen atom, and a group similar to a substituent derived from an acidic functional group.

The polybenzoxazole precursor may include a structural unit other than the above-described structural units. Specific examples of the structural unit other than the above-described structural units include a residue of diamino siloxane. Accordingly, adhesion to a silicon substrate or the like can be reinforced.

The polybenzoxazole precursor preferably has a cyclic compound group having no reactive unsaturated bond at a terminal thereof. The cyclic compound group having no reactive unsaturated bond may have a substituent. Specific examples of the substituent include a group similar to the arbitrary substituent of the substituent derived from the acidic functional group described above.

Specific examples of the cyclic compound group having no reactive unsaturated bond include a cyclopropyl group, a cyclobutyl group, a cyclopentyl group, a cyclohexyl group, a cyclohexylmethyl group, a cyclohexenyl group, a norbornyl group, a norbornenyl group, an adamantyl group, a 2-methylcyclopropenyl group, a 1-hydroxy-1-cyclopropyl group, a 1-carboxy-1-cyclopropyl group, a 1-carboxy-1-cyclobutyl group, a phenyl group, a 2-phenyl-1-cyclopropyl group, a 1-phenyl-1-cyclopropyl group, a 1-phenyl-1-cyclopentyl group and a 1-benzocyclobutenyl group.

As the cyclic compound group having no reactive unsaturated bond, an aliphatic cyclic compound group is preferred, and an aliphatic cyclic compound group having 3 to 4 carbon atoms is further preferred from a viewpoint of obtaining excellent cured resin properties.

For example, a cyclopropyl group, a cyclobutyl group, a 2-phenyl-1-cyclopropyl group, a 1-phenyl-1-cyclopropyl group, a 1-benzocyclobutenyl group, a 2-methylcyclopropenyl group, a 1-hydroxy-1-cyclopropyl group, a 1-carboxy-1-cyclopropyl group and a 1-carboxy-1-cyclobutyl group are preferred.

The cyclic compound group having no reactive unsaturated bond can be formed into a terminal of the polybenzoxazole precursor through an amide bond by allowing an active ester compound (for example, an acid halide compound, acid anhydride or the like) of the above-described cyclic compound group to react with the bisaminophenol compound under the organic solvent, for example.

An introduction rate of the above-described cyclic compound group can be controlled by changing an amount of addition of the active ester compound corresponding thereto. The amount of addition is preferably in the range of 0.5 to 40 mol % based on the bisaminophenol compound.

Weight-average molecular weight of the polybenzoxazole precursor is preferably 5,000 to 80,000, and more preferably 10,000 to 50,000. Moreover, a degree of dispersion is preferably 1.0 to 3.0, and more preferably 1.0 to 2.5.

The weight-average molecular weight can be determined by performing measurement according to a gel permeation chromatography (GPC) method, and converting by using a standard polystyrene calibration curve, for example.

The polyimide precursor can be obtained by allowing a diamine compound to react with tetracarboxylic dianhydride, for example.

The polyimide precursor is polyamide acid or an esterified compound thereof, and specific examples thereof include a material generally used for the photosensitive resin composition, and the material preferably has a structural unit represented by a general formula (3-1) and a structural unit represented by a general formula (3-2).

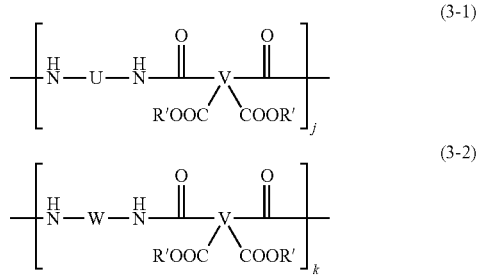

In the general formula (3-1) and the general formula (3-2), U and W are each independently a divalent organic group, and U is a group different from W. V is a tetravalent organic group. R' is each independently a hydrogen atom or a monovalent organic group. Then, j and k are a mole fraction, and when a sum of j and k is taken as 100 mol %, j is 60 to 100 mol % and k is 0 to 40 mol %.

The polyimide precursor may be a block copolymer having two kinds of the above-described structural units, or may be a random copolymer having two kinds of the above-described structural units.

Specific examples of the divalent organic group of U in the general formula (3-1) and W in the general formula (3-2) include a straight chain, branched chain or cyclic aliphatic group or an aromatic group. The aliphatic group or the aromatic group may have a substituent on a main chain. Specific examples of the substituent include a group similar to the arbitrary substituent of the substituent derived from the acidic functional group described above.

Specific examples of the aliphatic group and the aromatic group of U and W include groups similar to the aliphatic group and the aromatic group of X and T described above, respectively. U and W are preferably the aromatic group in view of the developer characteristics or the heat resistance.

As the divalent organic group of U in the general formula (3-1) and W in the general formula (3-2), a residue of the diamine compound is preferred.

Specific examples of the diamine compound include aromatic diamine such as p-phenylenediamine, m-phenylenediamine, benzidine, 3,3'-dimethyl-4,4'-diaminobiphenyl, 2,2'-dimethyl-4,4'-diaminobiphenyl, 3,3'-diethyl-4,4'-diaminobiphenyl, 2,2'-diethyl-4,4'-diaminobiphenyl, p-xylylenediamine, m-xylylenediamine, 1,5-diaminonaphthalene, 3,3'-dimethoxybenzidine, 4,4'-(or 3,4'-, 3,3'-, 2,4'-) diaminodiphenylmethane, 4,4'-(or 3,4'-, 3,3'-, 2,4'-)diaminodiphenyl ether (oxydianiline), 4,4'-(or 3,4'-, 3,3'-, 2,4'-) diaminodiphenyl sulfone, 4,4'-(or 3,4'-, 3,3'-, 2,4'-) diaminodiphenyl sulfide, 4,4'-benzophenonediamine, 3,3'-benzophenonediamine, 4,4'-bis(4-aminophenoxy)diphenyl sulfone, 4,4'-bis(4-aminophenoxy)biphenyl, 1,4-bis(4-aminophenoxy)benzene, 1,3-bis(4-aminophenoxy)benzene, 1,1,1,3,3,3-hexafluoro-2,2-bis(4-aminophenyl)propane, 2,2'-bis(trifluoromethyl)benzidine, 2,2-bis[4-(4-aminophenoxy) phenyl]propane, 3,3-dimethyl-4,4'-diaminodiphenylmethane, 3,3',5,5'-tetramethyl-4,4'-diaminodiphenylmethane, 4,4'-bis(3-aminophenoxy) diphenyl sulfone, 3,3'-diaminodiphenyl sulfone, 2,2'-bis(4-aminophenyl)propane, 5,5'-methylene-bis(anthranilic acid), 3,5-diaminobenzoic acid, 3,3'-dihydroxy-4,4'-diaminobiphenyl, and 3,3'-dimethyl-4,4'-diaminobiphenyl-6,6'-disulfonic acid; trimethylenediamine, tetramethylenediamine, hexamethylenediamine, 2,2-dimethylpropylenediamine, and 1,4-cyclohexanediamine, and any other compound can be used without limiting to the compounds described herein.

Above all, m-phenylenediamine and oxydianiline are preferred.

Specific examples of the tetravalent organic group of V in the general formula (3-1) and the general formula (3-2) include a straight chain, branched chain or cyclic aliphatic group or an aromatic group. The aliphatic group or the aromatic group may have a substituent on a main chain. Specific examples of the substituent include a group similar to the arbitrary substituent of the substituent derived from the acidic functional group described above.

Specific examples of the aliphatic group and the aromatic group of V include a group similar to a group in which the aliphatic group and the aromatic group of X and T are replaced by two COOR' groups.

V is preferably the aromatic group in view of the developer characteristics or the heat resistance.

As the tetravalent organic group of V in the general formula (3-1) and the general formula (3-2), a residue of tetracarboxylic dianhydride is preferred.

Specific examples of tetracarboxylic dianhydride include pyromellitic dianhydride, cyclohexyltetracarboxylic dianhydride, 3,3',4,4'-biphenyltetracarboxylic dianhydride, 2,3,3',4'-tetracarboxylic acid 2,3:3',4'-dianhydride, 3,3',4,4'-bicyclohexyltetracarboxylic dianhydride, 4,4'-oxydiphthalic dianhydride, 3,3',4,4'-benzophenonetetracarboxylic dianhydride, 1,2,5,6-naphthalenetetracarboxylic dianhydride, 1,4,5,8-naphthalenetetracarboxylic dianhydride, 4,4'-sulfonyldiphthalic dianhydride and 2,2-bis(3,4-dicarboxyphenyl) propane dianhydride, and any other compound can be used without limiting to the compounds described above.

Above all, 3,3',4,4'-biphenyltetracarboxylic dianhydride or 4,4'-oxydiphthalic dianhydride is preferred.

Specific examples of R' in the general formula (3-1) and the general formula (3-2) include a group similar to the substituent derived from the acidic functional group. Hydroxyalkyl (preferably alkyl having 1 to 6 carbon atoms) (meth)acrylate, such as 2-hydroxyethyl methacrylate is particularly preferred.

Mole fractions of j in the general formula (3-1) and k in the general formula (3-2) are preferably 80 to 100 mol % and 0 to 20 mol %, respectively. Accordingly, a dissolution rate during pattern creation can be easily adjusted to a suitable range.

Weight-average molecular weight of the polyamide acid ester described above is preferably 2,000 to 200,000, more preferably 3,000 to 100,000, and further preferably 4,000 to 60,000. Moreover, a degree of dispersion is preferably 1.0 to 3.0, and more preferably 1.0 to 2.5.

The weight-average molecular weight can be determined by performing measurement according to the GPC method, and converting by using the standard polystyrene calibration curve, for example.

Specific examples of copolymers of the polyimide precursor and the polybenzoxazole precursor include copolymers of the polyimide precursor and the polybenzoxazole precursor described above. The copolymer may be the block copolymer or the random copolymer.

Weight-average molecular weight of the copolymer is preferably 5,000 to 80,000. Moreover, a degree of dispersion is preferably 1.0 to 3.0, and more preferably 1.0 to 2.5.

The weight-average molecular weight can be determined by performing measurement according to the GPC method, and converting by using the standard polystyrene calibration curve, for example.

(Component (B))

The component (B) is not particularly limited, and a publicly-known material can be used, and a photoacid generator generating acid by active light, and a photopolymerization initiator generating a radical by active light are preferred.

Such a component (B) is used to allow generation of acid to increase solubility of a portion irradiated with light in an alkali aqueous solution, or promotion of a polymerization reaction of the component (A) and the like to reduce solubility in the solution.

When the component (A) is the polyimide precursor, as the component (B), the photopolymerization initiator is preferred.

Specific examples of the active light include ultraviolet light such as an i-line, visible light and radiation.

Specific examples of the photoacid generator include an o-quinonediazido compound, aryldiazonium salt, diaryliodonium salt and triarylsulfonium salt.

Specific examples of the o-quinonediazido compound include a compound that can be obtained by allowing a condensation reaction between o-quinonediazidosulfonyl chlorides and a hydroxy compound, an amino compound or the like (preferably a hydroxy compound) in the presence of an agent of removing hydrochloric acid.

Specific examples of o-quinonediazidosulfonyl chlorides include 1-benzoquinone-2-diazido-4-sulfonyl chloride, 1-naphthoquinone-2-diazido-5-sulfonyl chloride and 1-naphthoquinone-2-diazido-4-sulfonyl chloride.

Specific examples of the hydroxy compound include hydroquinone, resorcinol, pyrogallol, bisphenol A, bis(4-hydroxyphenyl)methane, 2,2-bis(4-hydroxyphenyl) hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, tris(4-hydroxyphenyl)ethane and 1,1-bis(4-hydroxyphenyl)-1-{[2-(4-hydroxyphenyl)-2-propyl]phenyl}ethane.

Specific examples of the amino compound include p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane and bis(4-amino-3-hydroxyphenyl)hexafluoropropane.

Specific examples of the aryldiazonium salt, the diaryliodonium salt and the triarylsulfonium salt described above include benzenediazonium-p-toluenesulfonate, diphenyliodonium-9,10-dimethoxyanthracene-2-sulfonate, tris(4-t-butylphenyl)sulfonium trifluoromethanesulfonate, N-naphthalimide trifluoromethanesulfonate, p-nitrobenzyl-9,10-dimethoxyanthracene-2-sulfonate, 4-methoxy-α-[[[(4-methylphenyl)sulfonyl]oxy]imino]benzeneacetonitrile and 2-(2'-furylethenyl)-4,6-bis(trichloromethyl)-1,3,5-triazine.

As the photopolymerization initiator, an oxime compound is preferred. Specific examples of the oxime compound include 1,2-octanedione-1-[4-(phenylthio)phenyl]-2-(O-benzoyloxime).

Moreover, specific examples of the photopolymerization initiator include Michler's ketone, benzoin, 2-methylbenzoin, benzoin methyl ether, benzoin ethyl ether, benzoin isopropyl ether, benzoin butyl ether, 2-t-butylanthraquinone, 1,2-benzo-9,10-anthraquinone, anthraquinone, methylanthraquinone, 4,4'-bis-(diethylamino)benzophenone, acetophenone, benzophenone, thioxanthone, 1,5-acenaphthene, 2,2-dimethoxy-2-phenylacetophenone, 1-hydroxycyclohexylphenyl ketone, 2-methyl-[4-(methylthio)phenyl]-2-morpholino-1-propanone, diacetylbenzyl, benzyl dimethyl ketal, benzyl diethyl ketal, diphenyl disulfide, anthracene, phenanthrenequinone, riboflavin tetrabutyrate, Acridine orange, erythrosine, phenanthrenequinone, 2-isopropylthioxanthone, 2,6-bis(p-diethylanninobenzylidene)-4-methyl-4-azacyclohexanone, 6-bis(p-dimethylaminobenzylidene)-cyclopentanone, 2,6-bis(p-diethylaminobenzylidene)-4-phenylcyclohexanone, amino styryl ketone, a 3-ketocoumarin compound, a biscoumarin compound, N-phenylglycine, N-phenyldiethanolamine and 3,3',4,4'-tetra(t-butylperoxycarbonyl)benzophenone.

The component (B) may be used alone in one kind, or in combination with two or more kinds thereof.

When the compound (B) is the photoacid generator, an amount of blending the component (B) is ordinarily 0.1 to 40 parts by mass, and preferably 1 to 20 parts by mass, based on 100 parts by mass of the component (A).

When the amount is 0.1 part by mass or more, an effect as a photosensitive agent tends to be easily obtained. When the amount is 40 parts by mass or less, irradiation light travels to a bottom portion, and the composition tends to be sufficiently cured.

When the component (B) is the photopolymerization initiator, the amount of blending the component (B) is ordinarily 0 to 25 parts by mass, preferably 0.1 to 20 parts by mass, and more preferably 0.1 to 15 parts by mass, based on 100 parts by mass of the component (A).

(Component (C))

As the component (C), an organic solvent is preferred.

Specific examples of a preferred material of the component (C) include a polar solvent such as γ-butyrolactone, N-methyl-2-pyrrolidone, N-acetyl-2-pyrrolidone, N,N-dimethylacetamide, N,N-dimethyl sulfoxide, hexamethylphosphorotriamide, dimethylimidazolidinone and N-acetyl-ε-caprolactam.

Moreover, as the component (C), ketones, esters, lactones, ethers, halogenated hydrocarbons, hydrocarbons or the like may be used, for example.

Specifically, for example, such a component can be used as acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, xylene, 1-methoxy-2-propanol, 1-methoxy-2-acetoxypropane, propylene glycol 1-monomethyl ether 2-acetate or the like.

The component (C) may be used alone in one kind, or in combination with two or more kinds thereof.

An amount of blending the component (C) is preferably 100 to 1,000 parts by mass, and more preferably 150 to 500 parts by mass, based on 100 parts by mass of the component (A).

(Component (D))

The component (D) is the nitrogen-containing aromatic compound represented by the general formula (1).

$R^1$ in the general formula (1) is a hydrogen atom or a hydrocarbon group, and as the hydrocarbon group, an alkyl group having 1 to 10 carbon atoms, an alkenyl group having 2 to 10 carbon atoms, a cyclic aliphatic group having 3 to 10 carbon atoms and a phenyl group are preferred.

Specific examples of the alkyl group having 1 to 10 carbon atoms of $R^1$ include a methyl group, an ethyl group, a propyl group, an isopropyl group, an n-butyl group, an s-butyl group, a t-butyl group, a cyclopentyl group, a cyclohexyl group, a 2-ethylhexyl group and an n-octyl group.

Specific examples of the alkenyl group having 2 to 10 carbon atoms of $R^1$ include a vinyl group and an allyl group.

Specific examples of the cyclic aliphatic group having 3 to 10 carbon atoms of $R^1$ include a cyclopropyl group, a cyclobutyl group, a cyclopentyl group and a cyclohexyl group.

$R^2$ in the general formula (1) is a hydrogen atom, an amino group, an alkyl group (preferably having 1 to 10 carbon atoms), an alkenyl group (preferably having 2 to 10 carbon atoms), a cyclic aliphatic group having 3 to 10 carbon atoms or a phenyl group, and preferably a hydrogen atom and an amino group.

Specific examples of the alkyl group, the alkenyl group and the cyclic aliphatic group having 3 to 10 carbon atoms of $R^2$ include a group similar to the alkyl group having 1 to 10 carbon atoms, the alkenyl group having 2 to 10 carbon atoms and the cyclic aliphatic group having 3 to 10 carbon atoms of $R^1$ in the general formula (1).

A, B, and E are each independently N or $CR^3$. $R^3$ is a hydrogen atom or a monovalent organic group. When a plurality of $R^3$ exist, the plurality of $R^3$ may be identical to or different from each other.

Specific examples of the monovalent organic group of $R^3$ include a hydrocarbon group, an amino group, a carboxy group and a hydroxy group.

Specific examples of the hydrocarbon group include a group similar to the hydrocarbon group of $R^1$ in the general formula (1).

The component (D) is preferably a compound having a triazole skeleton or a tetrazole skeleton.

As the compound having the triazole skeleton, 1,2,4-triazole or 3-amino-1,2,4-triazole is preferred. As the compound having the tetrazole skeleton, 5-aminotetrazole is preferred.

Moreover, from a viewpoint of discoloration of the film, pKa in the component (D) is preferably less than 14.

The component (D) may be used alone in one kind, or in combination with two or more kinds thereof.

From a viewpoint of adhesion, an amount of blending the component (D) is preferably 0.1 to 20 parts by mass, more preferably 0.3 to 10 parts by mass, and further preferably 0.4 to 5 parts by mass, based on 100 parts by mass of the component (A).

(Other Components)

The photosensitive resin composition of the invention may contain a silane coupling agent (as an adhesion enhancer: hereinafter referred to as a component (E)), a crosslinking agent (hereinafter referred to as a component (F)), a dissolution promoter, a dissolution inhibitor, a stabilizer or the like.

In view of reactivity, as the component (E), alkoxy silanes are preferred, and specific examples include vinyltrimethoxysilane, N-(2-aminoethyl)-3-aminopropylmethyltrimethoxysilane, 3-aminopropyltrimethoxysilane, N-methylaminopropyltrimethoxysilane, 3-glycidoxypropyltrimethoxysilane, 2-(3,4-epoxycyclohexyl)ethyltrimethoxysilane, 3-methacryloxypropyltrimethoxysilane, 3-mercaptopropyltrimethoxysilane, N-(1, 3-dimethylbutylidene)-3-(triethoxysilyl)-1-propanamine, N,N-bis(3-(trimethoxysilyl)propyl)ethylenediamine, N-(3-trimethoxysilylpropyl)pyrrole, ureidopropyltrimethoxysilane, (3-triethoxysilylpropyl)-t-butylcarbamate, N-phenylaminopropyltrimethoxysilane, 3-isocyanatepropyltriethoxysilane, (furfuryloxymethyl)triethoxysilane and N,N-(diethanol)-3-(triethoxysilyl)-1-propanamine.

When the component (A) contains the component (E), an amount of blending the component (E) is preferably 0.1 to 20 parts by mass, more preferably 0.3 to 10 parts by mass, and further preferably 0.5 to 8 parts by mass, based on 100 parts by mass of the component (A).

Specific examples of the component (F) include a thermal crosslinking agent and a radical reactive crosslinking agent.

The thermal crosslinking agent is a compound having a structure from which a crosslinking structure may be formed by reaction with the component (A) upon heating a photosensitive resin film after pattern formation to cure the film.

A temperature at which the thermal crosslinking agent may cause crosslinking is preferably 150° C. or higher so as to prevent progress of crosslinking of the photosensitive resin composition in each step of coating, drying, exposure to light and development.

The crosslinking agent may be such a compound which causes crosslinking with the component (A), and polymerizes between molecules of the crosslinking agent in combination therewith. Above all, a compound represented by a general formula (5) is preferred in view of small drop of film physical properties even upon being cured at a low temperature of 220° C. or lower and excellent physical properties of the film.

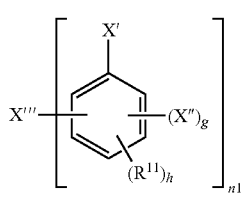
(5)

(In the formula, X''' is a hydrogen atom, a single bond or a monovalent to tetravalent organic group, X' is H, OH, OR$^{30}$, COOH or COOR$^{30}$ (R$^{30}$ is a monovalent organic group having 1 to 20 carbon atoms), X'' is a group which may cause crosslinking with a polybenzoxazole precursor by heat or may cause polymerization of the crosslinking agents with each other by heat, R$^{11}$ is a monovalent organic group, n1 is an integer from 1 to 4, g is an integer from 1 to 4, and h is an integer from 0 to 4).

In the general formula (5), specific examples of the organic group represented by X''' include an alkylene group having 1 to 10 carbon atoms, such as a methylene group, an ethylene group and a propylene group, an alkylidene group having 2 to 10 carbon atoms, such as an ethylidene group, an arylene group having 6 to 30 carbon atoms, such as a phenylene group, a group in which part or all of hydrogen atoms of the hydrocarbon groups described above are substituted by a halogen atom such as a fluorine atom, a sulfone group, a carbonyl group, an ether bond, a thioether bond and an amide bond. Moreover, specific examples of the preferred group include a divalent organic group represented by a general formula (6).

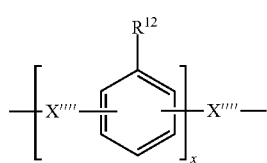
(6)

(In the formula, X'''' is each independently selected from an alkylene group (having 1 to 10 carbon atoms, for example), an alkylidene group (having 2 to 10 carbon atoms, for example), a group in which part or all of hydrogen atoms thereof are substituted by a halogen atom, a sulfone group, a carbonyl group, an ether bond, a thioether bond, an amide bond and the like, R$^{12}$ is a hydrogen atom, a hydroxy group, an alkyl group or a haloalkyl group, and when a plurality of R$^{12}$ exist, R$^{12}$ may be identical to or different from each other, and x is an integer from 1 to 10).

Specific examples of the monovalent organic group of R$^{11}$ in the general formula (5) include a hydrocarbon group such as a methyl group, an ethyl group, an n-propyl group, an isopropyl group, an n-butyl group, a t-butyl group and an amyl group, but are not limited thereto.

The crosslinking agent in which X'' is a group represented by —CH$_2$OR$^{16}$ (R$^{16}$ is a hydrogen atom or a monovalent organic group) or a group to be converted into isocyanate by heat is preferred because of excellent photosensitive characteristics. The group to be converted into isocyanate by heat is not particularly limited as long as the group is converted into isocyanate by heat, and specific examples thereof include a group having a structure as represented by a general formula (7).

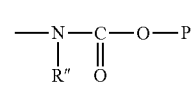
(7)

(In the formula, R'' is a hydrogen atom or a monovalent organic group, and P is a monovalent organic group having 1 to 20 carbon atoms. The monovalent organic group of P may have a nitrogen atom or an unsaturated bond).

Further, a compound represented by a general formula (8) is excellent in the photosensitive characteristics, and a compound represented by a general formula (9) is excellent also in solvent resistance and flux resistance of a cured film in curing under a low temperature of 220° C. or lower, and therefore specific examples of particularly preferred compounds as the crosslinking agent include these compounds.

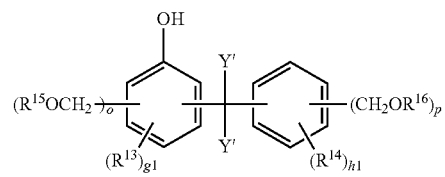
(8)

(In the formula, two Y' are each independently a hydrogen atom, an alkyl group having 1 to 10 carbon atoms or an alkyl group having 1 to 10 carbon atoms containing an oxygen atom or a fluorine atom (preferably a trifluoromethyl group), R$^{13}$ and R$^{14}$ are each independently a hydrogen atom, a hydroxy group or a monovalent organic group, R$^{15}$ and R$^{16}$ are each independently a hydrogen atom or a monovalent organic group, o and p are each independently an integer from 0 to 3 (preferably 2 or 3), and g1 and h1 are each independently an integer from 0 to 4).

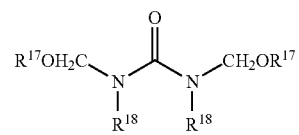
(9)

(In the formula, a plurality of R$^{17}$ are each independently a hydrogen atom or a monovalent organic group, and a plurality of R$^{18}$ are each independently a hydrogen atom or a monovalent organic group, and may be bonded with each other into a ring structure which may have a substituent).

Specific examples of the substituent include a group similar to the arbitrary substituent of the substituent derived from the acidic functional group described above.

In the general formula (8), specific examples of a group containing an oxygen atom, as Y', include an alkyloxy group, and specific examples of a group containing a fluorine atom include a perfluoroalkyl group. Moreover, specific examples of the monovalent organic group of $R^{13}$ to $R^{16}$ include a hydrocarbon group such as a methyl group, an ethyl group, an n-propyl group, an isopropyl group, an n-butyl group, a t-butyl group and an amyl group, but are not limited thereto.

In the general formula (9), specific examples of the monovalent organic group of $R^{17}$ and $R^{18}$ include a hydrocarbon group such as a methyl group, an ethyl group, an n-propyl group, an isopropyl group, an n-butyl group, a t-butyl group and an amyl group, but are not limited thereto.

Moreover, specific examples of the compound represented by the general formula (9) include a compound represented by a general formula (10).

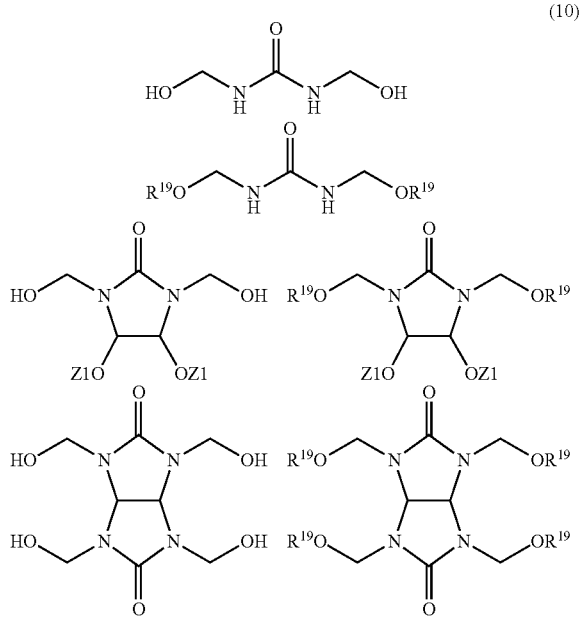

(10)

(In the formula, Z1 represents each independently an alkyl group having 1 to 10 carbon atoms, and $R^{19}$ represents each independently an alkyl group having 1 to 20 (preferably 1 to 10) carbon atoms).

Moreover, as the thermal crosslinking agent, melamine, or melamine in which a site in an N position is substituted by a methylol group or an alkoxymethyl group (preferably, a methoxymethyl group or an ethoxymethyl group) may be used, and specific examples include hexamethylolmelamine.

Specific examples of the radical reactive crosslinking agent include (meth)acrylic acid alkyl ester. Specific examples of the (meth)acrylic acid alkyl ester include a compound represented by a general formula (11).

(11)

In the formula, $R^{20}$ represents a hydrogen atom or a methyl group, and $R^{21}$ represents an alkyl group having 4 to 20 carbon atoms.

Specific examples of the alkyl group having 1 to 20 carbon atoms represented by $R^{21}$ include a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group and a structural isomer thereof.

Specific examples of the compound represented by the general formula (11) include (meth)acrylic acid butyl ester, (meth)acrylic acid pentyl ester, (meth)acrylic acid hexyl ester, (meth)acrylic acid heptyl ester, (meth)acrylic acid octyl ester, (meth)acrylic acid nonyl ester, (meth)acrylic acid decyl ester, (meth)acrylic acid undecyl ester, (meth)acrylic acid dodecyl ester, (meth)acrylic acid tridecyl ester, (meth)acrylic acid tetradecyl ester, (meth)acrylic acid pentadecyl ester, (meth)acrylic acid hexadecyl ester, (meth)acrylic acid heptadecyl ester, (meth)acrylic acid octadecyl ester, (meth)acrylic acid nonadecyl ester and (meth)acrylic acid eicosyl ester.

The component (F) may be used alone in one kind, or in combination with two or more kinds thereof.

From viewpoints of sensitivity during photosensitization, resolution, chemical resistance or flux resistance of the cured film, when the component (A) contains the component (F), as an amount of blending the component (F), the component (F) is preferably used in 5 parts by mass or more, and more preferably 10 parts by mass or more, based on 100 parts by mass of the component (A). Moreover, from a viewpoint of a balance with the photosensitive characteristics, the amount of blending the component (F) is further preferably adjusted to 10 to 50 parts by mass, based on 100 parts by mass of the component (A).

The dissolution promoter can be added thereto for the purpose of improving contrast. Specific examples of the dissolution promoter include a compound containing an acidic functional group. As the acidic functional group, a phenolic hydroxy group, a carboxylic acid group or a sulfonic acid group is preferred.

Specific examples of such a dissolution promoter include methylenebisphenol, 2,2-methylenebis(4-methylphenol), 4,4-oxybisphenol, 4,4-(1-methylethylidene)bis(2-methylphenol), 4,4-(1-phenylethylidene)bisphenol, 5,5-(1-methylethylidene)bis(1,1-(biphenyl)-2-ol), 4,4,4-ethylidynetrisphenol, 2,6-bis((2-hydroxy-5-methylphenyl)methyl)-4-methylphenol, 4,4-(1-(4-(1-(4-hydroxyphenyl)-1-methylethyl)phenyl)ethylidene)bisphenol, 4,4-sulfonyldiphenol, (2-hydroxy-5-methyl)-1,3-benzenedimethylol, 3,3-methylenebis(2-hydroxy-5-methylbenzenemethanol), salicylic acid, malonic acid, glutaric acid, 2,2-dimethylglutaric acid, maleic acid, diglycolic acid, 1,1-cyclobutanedicarboxylic acid, 3,3-tetramethyleneglutaric acid, 1,3-cyclohexanedicarboxylic acid, 1,4-cyclohexanedicarboxylic acid, 1,3-adamantanedicarboxylic acid, 1,2-phenylenedioxydiacetic acid, 1,3-phenylenediacetic acid, 1,4-phenylenediacetic acid, terephthalic acid, isophthalic acid, 4,4'-oxydiphenyldicarboxylic acid, 4,4-biphenyldicarboxylic acid and 4-hydroxybenzenesulfonic acid.

The dissolution promoters can be used alone, or in combination with two or more kinds thereof.

The dissolution inhibitor is a compound which inhibits dissolution properties of the component (A) in a developer, and may be used in order to control a residual film thickness, a developing time and the contrast. When an alkali-soluble resin is used, specific examples thereof include diphenyliodonium nitrate, bis(p-t-butylphenyl)iodonium nitrate, diphenyliodonium bromide, diphenyliodonium chloride and diphenyliodonium iodide.

In view of an acceptable range of the sensitivity and the developing time, a content when the component (A) contains the dissolution inhibitor is preferably 0.01 to 20 parts by mass, more preferably 0.01 to 15 parts by mass, and further preferably 0.05 to 10 parts by mass, based on 100 parts by mass of the component (A).

The photosensitive resin composition of the invention may be composed of the component (A), the component (B), the component (C) and the component (D) in 90% by mass or more, 95% by mass or more, 98% by mass or more, 99% by mass or more, 99.5% by mass or more, 99.9% by mass or more or 100% by mass, for example.

Moreover, the photosensitive resin composition of the invention may be composed of the component (A), the component (B), the component (C) and the component (D), and one or more selected from the group consisting of the component (E), the component (F), the dissolution promoter, the dissolution inhibitor and the stabilizer in 90% by mass or more, 95% by mass or more, 98% by mass or more, 99% by mass or more, 99.5% by mass or more, 99.9% by mass or more or 100% by mass, for example.

A cured product of the invention can be obtained by curing the above-described photosensitive resin composition. The cured product of the invention may be used as a patterned cured film or as a pattern-less cured film.

A method for manufacturing the patterned cured film has a step of coating the above-described photosensitive resin composition onto a substrate and drying the resultant material to form the photosensitive resin film (film forming step), a step of exposing the photosensitive resin film to light (exposure step), a step of developing the photosensitive resin film after exposure to light by using the alkali aqueous solution to form a patterned resin film (developing step), and a step of heating the patterned resin film (heating step), for example.

A method for manufacturing the pattern-less cured film has the film forming step and the heating step described above, for example. The method may further has the exposure step.

In the film forming step, the above-described photosensitive resin composition is coated on a support substrate such as a metal substrate including Cu, a glass substrate, a semiconductor, a metal oxide insulator (for example, $TiO_2$, $SiO_2$) and silicon nitride according to a dipping method, a spray method, a screen printing method, a spin coating method or the like, for example.

From a viewpoint of operability, the photosensitive resin composition coated thereon can be dried by heating (for example, at 90 to 150° C., for 1 to 5 minutes) using a hot plate, an oven or the like, and the resulting material can also be used.

Before coating the composition, the support substrate may be washed with acetic acid or the like.

A thickness of the photosensitive resin film obtained is preferably 5 to 20 μm.

In the exposure step, the photosensitive resin film formed on the substrate is irradiated with the above-described active light through a mask, for example. From a viewpoint of transparency of the component (A), irradiation with the i-line can be preferably used. After exposure to light, post exposure bake (PEB) may be performed, when necessary. A temperature of the post exposure bake is preferably 70 to 140° C., and a time of the post exposure bake is preferably 1 to 5 minutes.

In the developing step, the photosensitive resin film is patterned by removing an exposed portion of the photosensitive resin film after the exposure step by using the developer, for example. In the case of an alkali-soluble photosensitive resin composition, as the developer, for example, an alkali aqueous solution of sodium hydroxide, potassium hydroxide, sodium silicate, ammonia, ethylamine, diethylamine, triethylamine, triethanolamine, tetramethylammonium hydroxide (TMAH) or the like is preferably used. A base concentration of the aqueous solution thereof is preferably adjusted to 0.1 to 10% by mass. Further, alcohols or a surfactant can be added to the developer and the resultant mixture can also be used. The alcohols or the surfactant can be each blended in the range of preferably 0.01 to 10 parts by mass, and more preferably 0.1 to 5 parts by mass, based on 100 parts by mass of the developer. The patterned photosensitive resin film is referred to as the patterned resin film.

In the heating step, the photosensitive resin composition can be cured by heating the patterned resin film or the photosensitive resin film. In particular, the film obtained by curing the patterned resin film is referred to as the patterned cured film.

A heating temperature is preferably 100 to 500° C., and in view of sufficiently preventing an electronic component from being damaged by heat, the heating temperature is preferably 250° C. or lower, more preferably 225° C. or lower, and further preferably 140 to 210° C.

A heating time is preferably 20 minutes to 6 hours, and more preferably 30 minutes to 3 hours.

Multistep heating may be performed.

For example, heating treatment can be performed by using an oven such as a quartz tube oven, a hot plate, a rapid thermal anneal, a vertical diffusion oven, an infrared curing oven, an electron beam curing oven and a microwave curing oven. Moreover, any one of the heat treatment in the atmosphere, an inert atmosphere such as a nitrogen atmosphere or the like can be selected, but the heating treatment performed under nitrogen can further prevent oxidation of a pattern, and therefore such a case is preferred.

The cured product of the invention can be used as an interlayer insulating film, a surface protective film or the like.

The interlayer insulating film and the surface protective film of the invention can be used for the electronic component or the like, and the electronic component of the invention can be used for a semiconductor device or the like. The above-described semiconductor device can be used for various electronic devices or the like.

Accordingly, the cured product of the invention exhibits an excellent rust prevention effect and adhesion effect on the support substrate (particularly, a copper substrate, a copper alloy substrate), and discoloration of the cured film or the support substrate (particularly, the copper substrate, the copper alloy substrate) can be suppressed.

Specific examples of the above-described semiconductor device include a semiconductor package such as a wafer level chip size package (VVLCSP) and a fan out wafer level package (FOWLP).

Moreover, the interlayer insulating film and the surface protective film of the invention may be used for a circuit forming substrate, and the above-described circuit forming substrate can be used for a suspension for hard disk drive, a flexible wiring board or the like.

EXAMPLES

Hereinafter, Examples and Comparative Examples will be described, but the invention is not limited to Examples and Comparative Examples described below.

Manufacturing Example 1 (Synthesis of A-1)

In a 0.2-L flask provided with a stirrer and a thermometer, 60 g of N-methylpyrrolidone was put, 13.92 g (38 mmol) of 2,2'-bis(3-amino-4-hydroxyphenyl)hexafluoropropane was added thereto, and the resulting mixture was stirred and dissolved therein. Subsequently, while keeping a temperature at 0 to 5° C., 8.55 g (32 mmol) of dodecanedioic acid dichloride and 2.36 g (8 mmol) of diphenyl ether dicarboxylic acid dichloride were each added thereto while taking 10 minutes, and then the resulting mixture was required to room temperature, and continuously stirred for 3 hours.

The stirred solution was put in 3 L of water, and precipitates were collected and washed with pure water 3 times, and then dried under reduced pressure to obtain polyhydroxyamide (polybenzoxazole precursor) A-1. GPC measurement under the following measuring conditions was performed on A-1, and from the measured value obtained, weight-average molecular weight determined by a standard polystyrene equivalent according to a GPC method was 39,500, and a degree of dispersion was 1.9. On A-1, a mole fraction of a structural unit derived from dodecanedioic acid was 80 mol %, and a mole fraction of a structural unit derived from diphenyl ether dicarboxylic acid was 20 mol %.
(Measuring Conditions of Weight-Average Molecular Weight According to the GPC Method)

Measuring instrument: Detector L4000 UV, made by Hitachi, Ltd.

Pump: L6000, made by Hitachi, Ltd.

Recorder: C-R4A Chromatopac, made by Shimadzu Corporation

Measuring conditions: column: Gelpack GL-S300MDT-5×2

Eluent: THF (tetrahydrofuran)/DMF (N,N-dimethylformamide)=1/1 (volume ratio)

LiBr (0.03 mol/L), $H_3PO_4$ (0.06 mol/L)

Flow rate: 1.0 mL/min, detector: UV 270 nm

Measurement was performed by using a solution having 1 mL of a solvent [THF/DMF=1/1 (volume ratio)], based on 0.5 mg of a polymer.
Manufacturing Example 2 (Synthesis of A-2)

In a 1.0-L flask provided with a stirrer and a thermometer, 62.0 g (199.9 mmol) of 4,4'-oxydiphthalic dianhydride, 5.2 g (40.0 mmol) of 2-hydroxyethyl methacrylate and a catalyst amount of 1,4-diazabicyclo[2.2.2.]octane triethylenediamine were dissolved in 250.0 g of N-methyl-2-pyrrolidone, the resulting mixture was stirred at 45° C. for 1 hour, and then cooled down to 25° C., and 5.5 g (50.9 mmol) of m-phenylenediamine, 23.8 g (118.9 mmol) of oxydianiline and 100 mL of dry N-methyl-2-pyrrolidone were added thereto, and then the resulting mixture was stirred at 45° C. for 150 minutes, and cooled down to room temperature.

To the solution, 78.5 g (373.8 mmol) of trifluoroacetic anhydride was added dropwise, and then the resulting mixture was stirred for 20 minutes, and 53.1 g (408.0 mmol) of 2-hydroxyethyl methacrylate was added thereto, and the resulting mixture was stirred at 45° C. for 20 hours. The reaction solution was added dropwise to distilled water, and deposits were collected by filtration, and dried under reduced pressure to obtain polyamide acid ester A-2. Weight-average molecular weight of A-2 was determined in the same manner as in Manufacturing Example 1. The weight-average molecular weight was 35,000.
Examples 1 to 13 and Comparative Examples 1 to 2

A-1 obtained in Manufacturing Example 1, A-2 obtained in Manufacturing Example 2 and the following components (B) to (F) were blended at a blending amount (parts by mass) described in Table 1 to prepare a photosensitive resin composition.

In Table 1, in each column of a component other than a component (A), each numeric value represents an amount of addition (parts by mass) based on 100 parts by mass of the component (A).

The following component was arranged as the component (B).

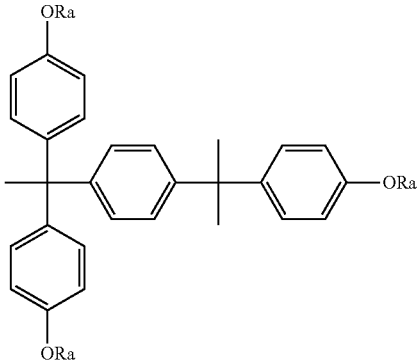

B-1

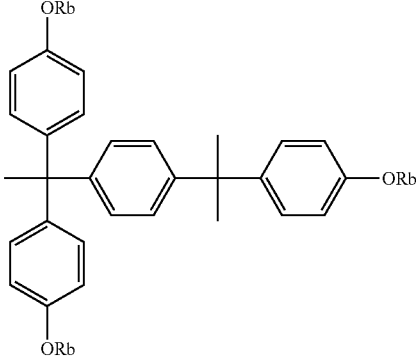

B-2

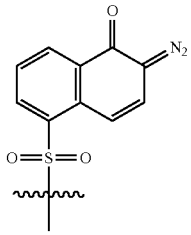 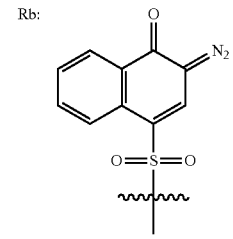

B-3: 1,2-octanedione-1-[4-(phenylthio)phenyl]-2-(O-benzoyloxime) (IRGACURE-OXE-01, made by BASF SE)

The following component was arranged as the component (C).

C-1: γ-butyrolactone/propylene glycol 1-monomethyl ether 2-acetate (9/1 in a volume ratio)

C-2: γ-butyrolactone

C-3: N-methyl-2-pyrrolidone

The following component was arranged as the component (D).

D-1: 5-aminotetrazole

D-2: 1,2,4-triazole

The following component was arranged as the component (E). Et denotes an ethyl group.

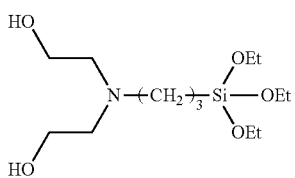

E-1

The following component was arranged as the component (F). Me denotes a methyl group.

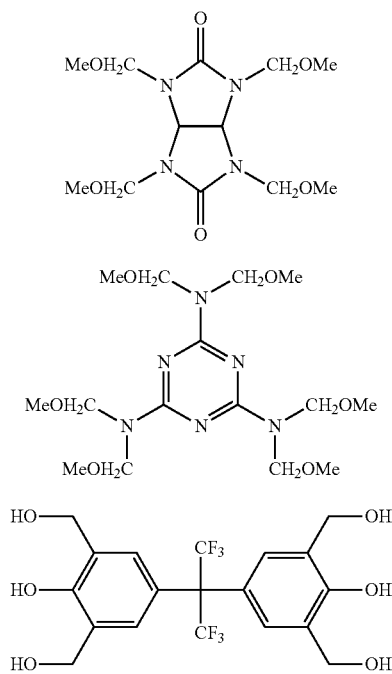

F-1

F-2

F-3

In order to uniformize surface conditions, a Cu substrate was washed with acetic acid. The photosensitive resin composition obtained was spin-coated on the above-described Cu substrate, and heated at 120° C. for 3 minutes to form a resin film having a thickness of 11 to 12 μm.

The resin film was heat-treated by using Vertical Diffusion Furnace p-TF (made by Koyo Thermo Systems Co., Ltd.) at 100° C. for 0.5 hour in a nitrogen atmosphere, and further heated at 200° C. for 1 hour to obtain a cured film having a thickness of 10 μm.

(Evaluation of Discoloration Suppression)

Appearance was visually evaluated on the cured film obtained. A color of the cured film in Comparative Example 1 was deemed as being discolored and a color of the cured film in Example 1 was deemed as being not discolored, and suppression of discoloration was evaluated as described below. The results are shown in Table 1.

A: Discoloration was suppressed.
B: Discoloration was not suppressed.

(Evaluation of Adhesion)

The cured film obtained was cut into a cross cut of 10×10 with a razor by using Cross Cut Guide (made by COTEC Corporation), and the cured film was divided into 100 small pieces.

A pressure sensitive adhesive tape (made by 3M Japan Limited) was stuck thereonto, and the pressure sensitive adhesive tape was peeled. Adhesion was evaluated depending on the number of small pieces of the cured film peeled from the substrate upon peeling the pressure sensitive adhesive tape as described below. The results are shown in Table 1.

A: No peel was caused.
B: Peel of one or more pieces was caused.

(Evaluation of Adhesion after an Accelerated Test)

As an accelerated test, the cured film obtained was treated at 121° C., 100 RH (Relative Humidity) % and 2 atm for 100 hours. Adhesion was evaluated on the cured film after treatment in the same manner as in the above-described evaluation of adhesion. The results are shown in Table 1.

The present evaluation was not performed on the cured film of B in the results in (Evaluation of adhesion).

TABLE 1

| | Component (A) | Component (B) | Component (C) | Component (D) | Component (E) | Component (F) | Discoloration suppression | Adhesive | Adhesion after accelerated test |
|---|---|---|---|---|---|---|---|---|---|
| Example 1 | A-1 (100) | B-1 (11) | C-1 (200) | D-1 (2) | — | F-1 (25) | A | A | A |
| Example 2 | A-1 (100) | B-1 (11) | C-1 (200) | D-1 (0.5) | — | F-1 (25) | A | A | A |
| Example 3 | A-1 (100) | B-1 (11) | C-1 (200) | D-1 (2) | E-1 (6) | F-1 (25) | A | A | A |
| Example 4 | A-1 (100) | B-1 (11) | C-1 (200) | D-1 (0.5) | E-1 (6) | F-1 (25) | A | A | A |
| Example 5 | A-1 (100) | B-1 (11) | C-1 (200) | D-1 (2) | — | F-2 (25) | A | A | A |
| Example 6 | A-1 (100) | B-1 (11) | C-1 (200) | D-1 (2) | — | F-3 (25) | A | A | A |
| Example 7 | A-1 (100) | B-1 (11) | C-1 (200) | D-2 (2) | E-1 (6) | F-1 (25) | A | A | A |
| Example 8 | A-1 (100) | B-2 (11) | C-1 (200) | D-1 (2) | E-1 (6) | F-2 (25) | A | A | A |
| Example 9 | A-1 (100) | B-2 (11) | C-2 (200) | D-1 (0.5) | E-1 (6) | F-2 (25) | A | A | A |
| Example 10 | A-2 (100) | B-3 (5) | C-3 (200) | D-1 (0.5) | E-1 (3) | F-2 (35) | A | A | A |
| Example 11 | A-1 (100) | B-1 (11) | C-1 (200) | D-1 (2) | — | F-1 (25) | A | A | A |

TABLE 1-continued

| | Component (A) | Component (B) | Component (C) | Component (D) | Component (E) | Component (F) | Discoloration suppression | Adhesive | Adhesion after accelerated test |
|---|---|---|---|---|---|---|---|---|---|
| Example 12 | A-1 (100) | B-1 (11) | C-1 (200) | D-1 (2) | — | F-2 (25) | A | A | A |
| Comparative Example 1 | A-1 (100) | B-1 (11) | C-1 (200) | — | — | F-1 (25) | B | B | — |
| Comparative Example 2 | A-1 (100) | B-1 (11) | C-1 (200) | — | E-1 (6) | F-1 (25) | B | A | A |

INDUSTRIAL APPLICABILITY

A photosensitive resin composition of the invention can be used for a semiconductor device or the like. The semiconductor device of the invention can be used for various electronic devices or the like.

Several embodiments and/or Examples of the invention have been described in detail above, but those skilled in the art will readily make a great number of modifications to the exemplary embodiments and/or Examples without substantially departing from new teachings and advantageous effects of the invention. Accordingly, all such modifications are included within the scope of the invention.

The entire contents of the description of the Japanese application serving as a basis of claiming the priority concerning the present application to the Paris Convention are incorporated by reference herein.

The invention claimed is:

1. A photosensitive resin composition, comprising:
(A) polybenzoxazole precursor;
(B) a photoreactive compound;
(C) a solvent;
(D) a nitrogen-containing aromatic compound represented by the following general formula (1):

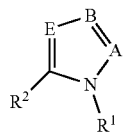

(wherein, $R^1$ is a hydrogen atom or a hydrocarbon group, $R^2$ is a hydrogen atom, an amino group, an alkyl group, an alkenyl group, a cyclic aliphatic group having 3 to 10 carbon atoms or a phenyl group, and A, B, and E are each independently N or $CR^3$; $R^3$ is a hydrogen atom or a monovalent organic group; and when a plurality of $R^3$ exist, the plurality of $R^3$ may be identical to or different from each other); and (F) one or more selected from the group consisting of a melamine, and a melamine in which a site in an N position is substituted by a methylol group or an alkoxymethyl group.

2. The photosensitive resin composition according to claim 1, wherein the polybenzoxazole precursor has a structural unit represented by the following general formula (2-1) and a structural unit represented by the following general formula (2-2):

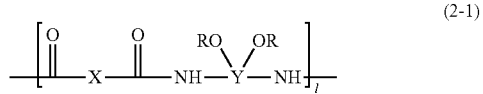

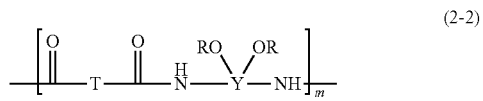

(wherein, X and T are each independently a divalent organic group, and X is a group different from T; Y is a tetravalent organic group, and R is each independently a hydrogen atom or a monovalent organic group; and l and m are a mole fraction, and when a sum of l and m is taken as 100 mol %, l is 60 to 100 mol % and m is 0 to 40 mol %).

3. The photosensitive resin composition according to claim 1, wherein the component (D) is a compound having a triazole skeleton or a tetrazole skeleton.

4. A cured product of the photosensitive resin composition according to claim 1.

5. An interlayer insulating film or a surface protective film, using the cured product according to claim 4.

6. An electronic component, comprising the interlayer insulating film according to claim 5.

7. An electronic component, comprising the surface protective film according to claim 5.

* * * * *